United States Patent [11] 3,614,629

[72] Inventor Lawrence B. Sues
Rome, N.Y.
[21] Appl. No. 849,718
[22] Filed Aug. 13, 1969
[45] Patented Oct. 19, 1971
[73] Assignee The United States of America as represented by the Secretary of the Air Force

[54] MAGNETIC PACKAGING MODULE
1 Claim, 4 Drawing Figs.

[52] U.S. Cl. ........ 325/355, 317/101 R, 330/4.8
[51] Int. Cl. ........ H04b 1/08, H03f 7/02
[50] Field of Search ........ 325/352, 353, 355, 356, 357; 330/4.8, 53, 54, 56, 63; 317/101 R, 215

[56] References Cited
UNITED STATES PATENTS

| | | | |
|---|---|---|---|
| 3,054,024 | 9/1962 | Dillen et al. | 317/101 |
| 3,009,123 | 11/1961 | Mims | 333/83 |
| 3,244,993 | 4/1966 | Schloemann | 330/4.8 |

*Primary Examiner*—Robert L. Richardson
*Attorneys*—Harry A. Herbert, Jr. and Ruth G. Codier

ABSTRACT: A radio frequency module employing a segmented magnetic structure for packaging a ferrimagnetic tuned circuit. The planar electronic circuitry is packaged in the center section of a three part magnetic structure. Connector pins positioned on the bottom of the module serve to conduct the output signals from the electronic circuitry and to control the magnetic field intensity by means of solenoids located in the outer sections of the module.

INVENTOR.
LAWRENCE B. SUES
BY Harry A. Herbert Jr
and
Ruth Cordier
ATTORNEYS

MAGNETIC PACKAGING MODULE

BACKGROUND OF THE INVENTION

This invention relates broadly to packaging of electronic circuits requiring both the application of a controlled magnetic field and active devices such as oscillators and more particularly to a segmented support module of magnetic material which serves as a package and as a unit for insertion intact into a circuit system.

As is well known, problems arise in the packaging of devices involving microwave frequencies where lengths of circuit transmission lines must be kept short and parasitic capacitance must be kept low for proper circuit operation. Problems of a similar nature also arise in the packaging of miniature ferrimagnetic devices.

SUMMARY OF THE INVENTION

The object of the present invention is to provide an efficient package which solves the problems mentioned above.

The package module of the invention can be used in conjunction with other active and passive circuitry, and is capable of facilitating and minimizing interconnections, permitting plug-in construction. It allows use of optimum transmission line technique for each part of a given circuit.

A further object of the invention is the provision of a plurality of magnetic circuit contact in a single housing, each segment of the circuitry having its own appropriate connector.

A central module has a segmented structure and provides a package for a plurality of ferrimagnetic tuned circuits in a single housing. The module includes a coaxial connector for the radio frequency circuitry, a plurality of pin connectors for the input power control signals and the intermediate frequency amplifier output.

The invention thus provides a practical means with plug-in capability for a complex magnetic circuit. It further provides a means of using miniature coaxial, microstrip stripline and waveguide transmission lines in conjunction with each other and a controlled magnetic field to shield sensitive elements and optimize electronic performance, and offering a solution to the problem of packaging miniature ferrimagnetic devices used in conjunction with other active and passive electronic circuitry.

The invention will permit the fabrication of miniature, wideband radio frequency tuner modules of higher performance and lower cost than present tuners fabricated from discrete components. Because of the unique construction technique employed, all components of the module may be readily tested with little possibility for damage in disassembly for component testing. Disassembly of conventional magnetic structures which enclose active devices is often destructive. Initial fabrication and assembly will also be simplified. A defective module can be readily repaired by replacing one of the three major physical parts of the module. Planar circuitry housed in the central section can also be repaired.

These and other advantages, features and objects of the invention will become more apparent from the following description taken in connection with the illustrative embodiment in the accompanying drawing.

DESCRIPTION OF THE DRAWING

The orientation of the package with respect to top, ends and sides is arbitrary in the following description.

DESCRIPTION OF THE PREFERRED EMBODIMENT

Figure 1:
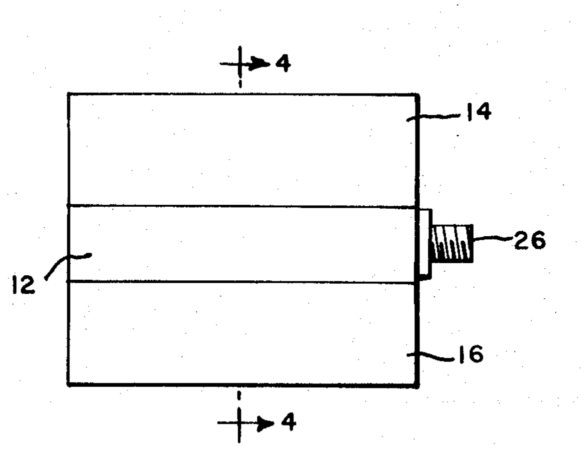
FIG. 1 is a top plan view of a packaging module according to the invention.
Figures 2, 3:
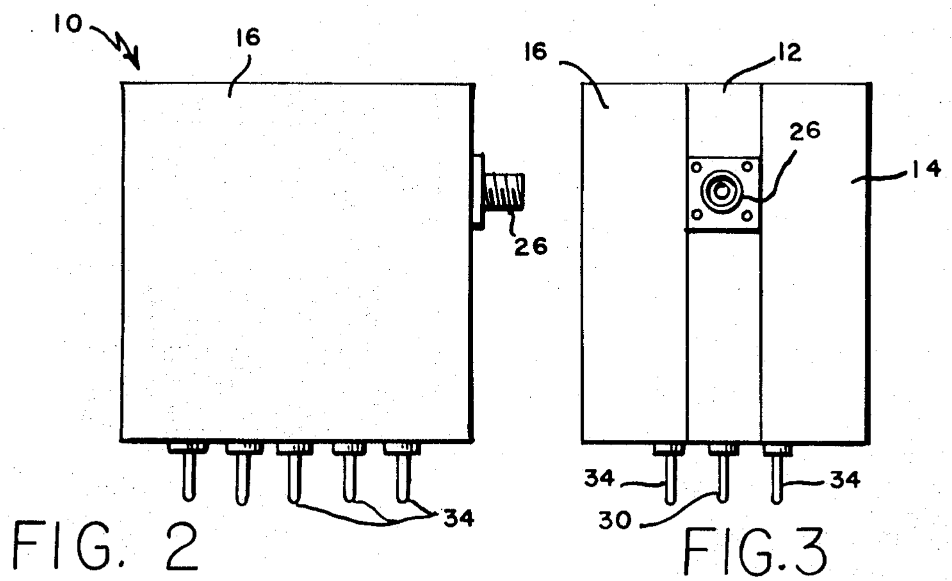
FIG. 2 is a side elevation of FIG. 1.
FIG. 3 is a end elevation of FIG. 1.
Figure 4:
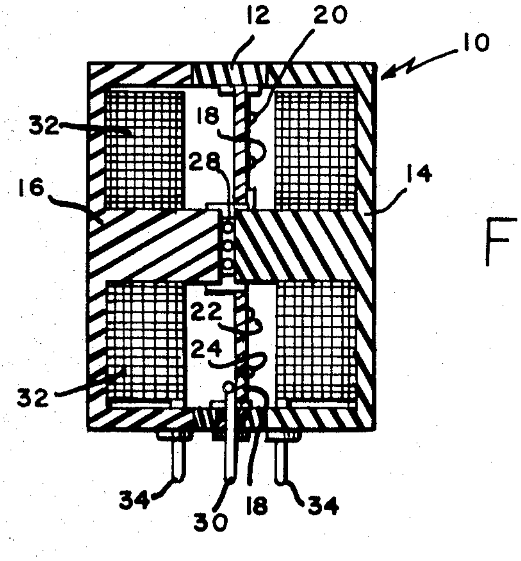
FIG. 4 is a cross section taken on the line 4—4 of FIG. 1.

Referring more particularly to the drawing, FIGS. 1, 2, 3 and 4 show a typical radio frequency module employing a segmented magnetic structure for packaging a ferrimagnetic tuned circuit. The module is indicated generally by the numeral 10. The magnetic structure is fabricated in three parts; a support structure 12 is oriented between a magnetic housing comprised of two sections 14 and 16; and a planar electronic circuit 18 is supported at the center of the module by the element 12 and carries among other components, a radio frequency amplifier mixer, local oscillator, and intermediate frequency amplifier indicated schematically at 20, 22 and 24.

The radio frequency input uses a miniature semirigid coaxial connector indicated at 26 to conduct the incoming signal to an Yittrium Iron Garnet spherical resonator 28 which functions as the preselector. Input power, control signals and intermediate frequency output are conducted out thru pins 30 located at the bottom of the module 10. Both outer sections 14 and 16 of the module 10 contain solenoids 32 for control of the magnetic field intensity. Each of these sections 14 and 16 has pins 34 on the bottom to connect to external analog driving circuitry.

Although the invention has been illustrated and described in terms of preferred embodiments thereof, it will be apparent to those skilled in the art that certain changes, alterations, modifications and substitutions, particularly with respect to the construction details, can be made in the arrangement and location of the various elements without departing from the true spirit and scope of the appended claims.

Having thus set forth and disclosed the nature of my invention, what I claim is:

1. A packaging module for planar radio frequency circuitry comprising a segmented magnetic structure, a structure central planar dividing said module vertically, yittrium iron garnet spherical resonators for preselection centrally located in said module, a miniature, semirigid coaxial connector for conducting incoming signals to said spherical resonators, said planar central structure carrying a planar electronic circuit comprising a radio frequency amplifier mixer, a local oscillator and an intermediate frequency amplifier, contact pins located at the base of said module for input power control signals and for intermediate frequency output; and solenoids in each section for control of the magnetic field intensity.